US012810955B2

(12) United States Patent
Park et al.

(10) Patent No.: US 12,810,955 B2
(45) Date of Patent: Nov. 24, 2026

(54) SEMICONDUCTOR DEVICE AND OPERATING METHOD USING THE SAME

(71) Applicant: SK hynix Inc., Icheon-si (KR)

(72) Inventors: Ung Hee Park, Icheon-si (KR); Gap Sok Do, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 74 days.

(21) Appl. No.: 18/787,931

(22) Filed: Jul. 29, 2024

(65) Prior Publication Data

US 2025/0292851 A1 Sep. 18, 2025

(30) Foreign Application Priority Data

Mar. 12, 2024 (KR) ........................ 10-2024-0034481

(51) Int. Cl.
*G11C 29/02* (2006.01)
*G11C 7/10* (2006.01)
*G11C 29/52* (2006.01)

(52) U.S. Cl.
CPC .......... *G11C 29/022* (2013.01); *G11C 7/1063* (2013.01); *G11C 29/52* (2013.01)

(58) Field of Classification Search
CPC .............................. G11C 29/022; G11C 29/52
See application file for complete search history.

(56) References Cited

U.S. PATENT DOCUMENTS 11,403,195 B2 8/2022 Xie et al.
2018/0061493 A1* 3/2018 Em .................... G11C 13/0069
2020/0381055 A1* 12/2020 Ko ...................... G11C 11/5671

FOREIGN PATENT DOCUMENTS

KR 10-1696530 B1 1/2017

* cited by examiner

*Primary Examiner* — Amir Zarabian
*Assistant Examiner* — Anthony Thinh Tang

(57) ABSTRACT

An operating method of a semiconductor device may include a write command reception step of receiving a write command, a pre-selection result determination step of determining whether a memory cell in which data are to be stored is a fail, and a write operation completion step of storing the data in the memory cell normally when the memory cell is determined to be normal.

8 Claims, 6 Drawing Sheets

SEMICONDUCTOR DEVICE AND OPERATING METHOD USING THE SAME

CROSS-REFERENCE TO RELATED APPLICATION

This application claims priority under 35 U.S.C. § 119 to Korean Patent Application No. 10-2024-0034481 filed on Mar. 12, 2024, which is incorporated herein by reference in its entirety.

BACKGROUND

1. Technical Field

Embodiments relate to an integrated circuit technology and, more particularly, to a semiconductor device and an operating method thereof.

2. Related Art

Recently, as an electronic device is reduced in size, has lower power consumption and higher performance, and is diversified, a semiconductor device capable of storing information is required for various electronic devices, such as computers and portable communication devices. The semiconductor device may be basically classified into a volatile memory device and a nonvolatile memory device. The volatile memory device can retain data only in the state in which power is supplied to the volatile memory device. The nonvolatile memory device can retain data although power is not supplied to the nonvolatile memory device.

The nonvolatile memory device representatively includes NAND type memory. Emerging memory technologies includes ferroelectric RAM (FRAM), magnetic RAM (MRAM), phase-change RAM (PRAM), polymer RAM (PoRAM), and resistance RAM (ReRAM).

SUMMARY

In an embodiment, an operating method of a semiconductor device may include a write command reception step of receiving a write command, a pre-selection result determination step of determining whether a memory cell in which data are to be stored is a fail, and a write operation completion step of storing the data in the memory cell normally when the memory cell is determined to be normal.

In an embodiment, a semiconductor device may include a voltage generation circuit configured to provide bias voltages to both ends of a memory cell or to block the provision of the bias voltages based on a voltage control signal after the start of a write operation, a sensing circuit configured to generate a sensing result signal by sensing a voltage level of any one of the both ends of the memory cell after the start of the write operation, and a control circuit configured to generate the voltage control signal by determining whether the memory cell is a fail memory cell based on the sensing result signal.

In an embodiment, a semiconductor device may include a memory cell that is connected between a bit line and a word line, a voltage generation circuit configured to provide a positive bias voltage and a negative bias voltage to a bit line and a word line, respectively, or block the provision of the positive bias voltage and the negative bias voltage based on a voltage control signal after the start of a write operation, a sensing circuit configured to generate a sensing result signal by sensing a voltage level of the negative bias voltage after the start of the write operation, and a control circuit configured to generate the voltage control signal based on the sensing result signal after the start of the write operation.

DETAILED DESCRIPTION

Hereinafter, embodiments according to the technical spirit of the present disclosure are described with reference to the accompanying drawings.

Embodiments of the present disclosure may provide a semiconductor device capable of detecting a malfunctioning memory cell, i.e., a failed memory cell, after the start of a write operation and an operating method thereof. Furthermore, embodiments of the present disclosure may provide a semiconductor device capable of performing bad block handling based on accumulation information with regard to a failed memory cell and an operating method thereof.

It is possible to improve the reliability of a semiconductor device by performing a bad block handling operation based on accumulation information by sensing or detecting a failed memory cell.

Figure 1:
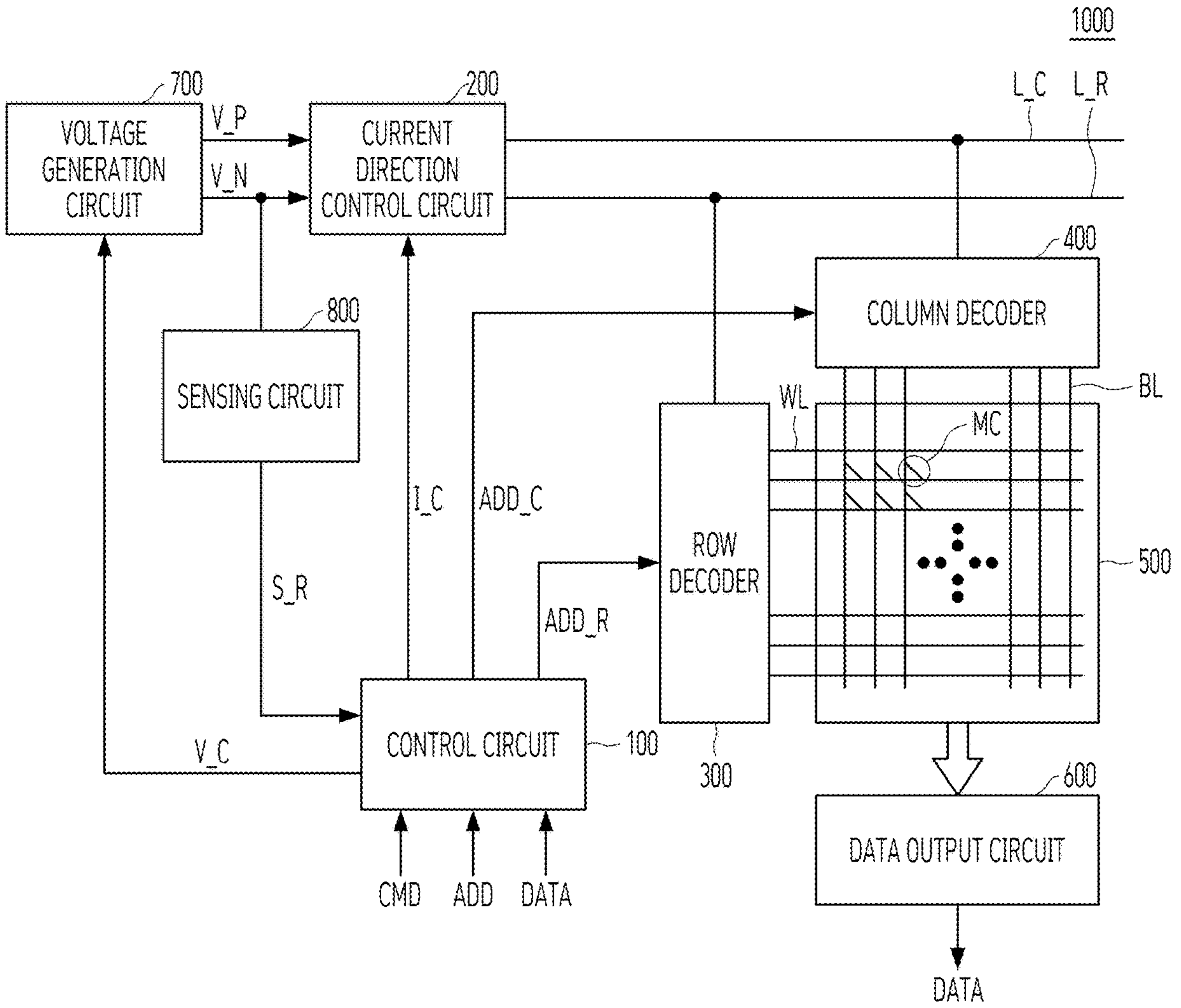
FIG. 1 illustrates a semiconductor device according to an embodiment of the present disclosure.

FIG. 1 illustrates a semiconductor device 1000 according to an embodiment of the present disclosure.

Referring to FIG. 1, the semiconductor device 1000 may include a control circuit 100, a current direction control circuit 200, a row decoder 300, a column decoder 400, a memory cell array 500, a data output circuit 600, a voltage generation circuit 700, and a sensing circuit 800.

The control circuit 100 may store data in the memory cell array 500 or may output data stored in the memory cell array 500 to an external device via the data output circuit 600 by controlling the current direction control circuit 200, the row decoder 300, the column decoder 400, the data output circuit 600, and the voltage generation circuit 700 based on a command signal CMD, an address signal ADD, a data signal DATA, and a sensing result signal S_R.

In this case, an operation of storing data in the memory cell array 500 may be called a write operation. An operation of outputting data stored in the memory cell array 500 to the external device may be called a read operation.

After the start of a write operation, the control circuit 100 may evaluate whether to proceed based on the activation status of a target memory cell initiated at the onset of the write operation.

For example, the control circuit 100 may generate a voltage control signal V_C, a current direction control signal I_C, a row address signal ADD_R, and a column address signal ADD_C based on the command signal CMD, the address signal ADD, and the data signal DATA.

More specifically, the control circuit 100 may generate the voltage control signal V_C and the current direction control signal I_C based on the command signal CMD and the data signal DATA, may provide the voltage control signal V_C to the voltage generation circuit 700, and may provide the current direction control signal I_C to the current direction control circuit 200. The control circuit 100 may generate the row address signal ADD_R based on the command signal CMD and the address signal ADD, and may provide the row address signal ADD_R to the row decoder 300. The control circuit 100 may generate the column address signal ADD_C based on the command signal CMD and the address signal ADD, and may provide the column address signal ADD_C to the column decoder 400.

After the start of the write operation, the sensing circuit 800 may generate the sensing result signal S_R by comparing a voltage level of any one of a positive bias voltage V_P and a negative bias voltage V_N, which are provided by the voltage generation circuit 700, with a voltage level of a reference voltage. At this time, the control circuit 100 may determine whether to continue the write operation based on the sensing result signal S_R.

For example, the semiconductor device 1000 may determine whether to continue the write operation based on the voltage level of the negative bias voltage V_N after the start of the write operation.

The current direction control circuit 200 may selectively provide the positive bias voltage V_P and the negative bias voltage V_N to a row voltage line L_R and a column voltage line L_C based on the current direction control signal I_C.

For example, when providing the positive bias voltage V_P to the row voltage line L_R based on the current direction control signal I_C, the current direction control circuit 200 may provide the negative bias voltage V_N to the column voltage line L_C. On the other hand, when providing the positive bias voltage V_P to the column voltage line L_C based on the current direction control signal I_C, the current direction control circuit 200 may provide the negative bias voltage V_N to the row voltage line L_R.

The row decoder 300 may select at least one of a plurality of word lines WL based on the row address signal ADD_R, and subsequently activate the selected word line WL using the bias voltage from the row voltage line L_R.

The column decoder 400 may select at least one of a plurality of bit lines BL based on the column address signal ADD_C, and subsequently activate the selected bit line BL using the bias voltage from the column voltage line L_C.

The memory cell array 500 may include a plurality of memory cells MC. In the memory cell array 500, the plurality of word lines WL and the plurality of bit lines BL intersect with each other. Each of the memory cells MC may be disposed at the intersection of a corresponding one of the word lines WL and a corresponding one of the bit lines BL. The memory cell MC may be electrically connected between the word line WL and the bit line BL. Furthermore, the memory cell MC may store data in a set or reset state depending on polarities of voltages that are provided thereto via the word line WL and the bit line BL. That is, the memory cell MC may store data in the set or reset state depending on a direction of a current flowing into the memory cell MC. The memory cell MC may be self-selecting memory including a chalcogenide alloy.

The data output circuit 600 may sense data stored in the memory cell MC through the word line WL or the bit line BL, and may output the sensed data to the external device. In this case, the data output circuit 600 may include an error correction code (ECC) circuit (not illustrated). The ECC circuit may detect and correct an error included in data sensed during a read operation, that is, when data stored in the memory cell array 500 is output to the external device.

The voltage generation circuit 700 may selectively provide the positive bias voltage V_P and the negative bias voltage V_N to the current direction control circuit 200 based on the voltage control signal V_C.

The sensing circuit 800 may generate the sensing result signal S_R based on an amount of current flowing through the memory cell MC after the start of the write operation, and may provide the sensing result signal S_R to the control circuit 100. For example, the sensing circuit 800 may generate the sensing result signal S_R based on the voltage level of any one of the positive bias voltage V_P and the negative bias voltage V_N. According to an embodiment, the sensing circuit 800 may generate the sensing result signal S_R based on the voltage level of the negative bias voltage V_N after the start of the write operation, and may provide the sensing result signal S_R to the control circuit 100.

As a result, the semiconductor device 1000 may distinguish the write operation from other operations based on the command signal CMD, and may select the word line WL and the bit line BL to access the memory cell in which the data signal DATA is to be stored, based on the address signal ADD. Furthermore, the semiconductor device 1000 may perform the write operation by controlling a current to flow from the word line WL to the bit line BL through the memory cell for a preset time or controlling a current to flow from the bit line BL to the word line WL through the memory cell for a preset time based on the data signal DATA after the start of the write operation. In this case, the semiconductor device 1000 may either permit the current flow into the memory cell for the preset time or suspend the current flow into the memory cell based on the sensing result signal S_R provided by the sensing circuit 800.

Figure 2A:
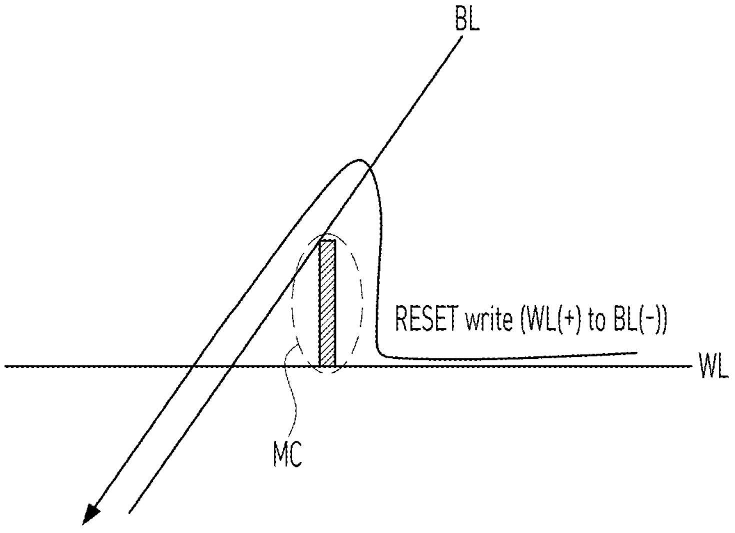
FIGS. 2A and 2B respectively describe a reset write operation and a set write operation of a memory cell included in a semiconductor device according to an embodiment of the present disclosure.
Figure 2B:
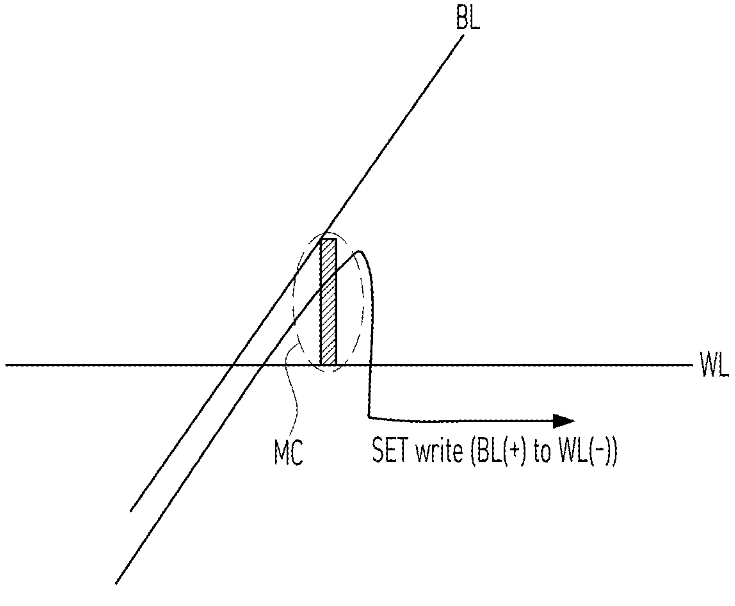

FIGS. 2A and 2B respectively describe a reset write operation and a set write operation of a memory cell MC included in a semiconductor device according to an embodiment of the present disclosure.

The memory cell MC may be electrically connected between a word line WL and a bit line BL. A direction of a current that flows into the memory cell MC may be determined depending on a polarity of a voltage that is applied to each of the word line WL and the bit line BL. A state of the memory cell MC may be changed into a set state or a reset state depending on the direction of the current. In this case, an operation of changing the state of the memory cell MC into the set state or the reset state may be called a write operation. Moreover, an operation of changing the state of the memory cell MC into the set state may be called a SET write operation. An operation of changing the state of the memory cell MC into the reset state may be called a RESET write operation.

Referring to FIG. 2A, the RESET write operation for changing the state of the memory cell MC into the reset state may be described as follows.

When the positive bias voltage V_P (indicated by (+) in FIG. 2) is applied to the word line WL and the negative bias voltage V_N (indicated by (−) in FIG. 2) is applied to the bit line BL, a current may flow from the word line WL to the bit line BL through the memory cell MC. At this time, the state of the memory cell MC may be changed into the reset state.

For example, the RESET write operation may be described as follows with reference to FIG. 1.

To change the state of the memory cell MC into the reset state, the current direction control circuit 200 may apply the positive bias voltage V_P to the row voltage line L_R and apply the negative bias voltage V_N to the column voltage line L_C based on the current direction control signal I_C provided by the control circuit 100.

The row decoder 300 may select one of the plurality of word lines WL based on the row address signal ADD_R, and subsequently activate the selected word line WL using the positive bias voltage V_P of the row voltage line L_R. At this time, a voltage level of the selected word line WL may be adjusted to match a voltage level of the positive bias voltage V_P.

The column decoder 400 may select one of the plurality of bit lines BL based on the column address signal ADD_C, and subsequently activate the selected bit line BL using the negative bias voltage V_N of the column voltage line L_C. At this time, a voltage level of the selected bit line BL may be adjusted to match a voltage level of the negative bias voltage V_N.

As a result, the current may flow from the selected word line WL to the selected bit line BL through the memory cell MC that is electrically connected between the selected word line WL and the selected bit line BL, among the plurality of memory cells MC. At this time, the state of the memory cell MC may be changed into the reset state.

The SET write operation for changing the state of the memory cell MC into the set state may be described as follows with reference to FIG. 2B.

When the positive bias voltage (+) is applied to the bit line BL and the negative bias voltage (−) is applied to the word line WL, a current may flow from the bit line BL to the word line WL through the memory cell MC. At this time, the state of the memory cell MC may be changed into the set state.

For example, the SET write operation may be described as follows with reference to FIG. 1.

To change the state of the memory cell MC into the set state, the current direction control circuit 200 may apply the positive bias voltage V_P to the column voltage line L_C and the negative bias voltage V_N to the row voltage line L_R based on the current direction control signal I_C provided by the control circuit 100.

The row decoder 300 may select one of the plurality of word lines WL based on the row address signal ADD_R, and subsequently activate the selected word line WL using the negative bias voltage V_N of the row voltage line L_R. At this time, the voltage level of the selected word line WL may be adjusted to match the voltage level of the negative bias voltage V_N.

The column decoder 400 may select one of the plurality of bit lines BL based on the column address signal ADD_C, and subsequently activate the selected bit line BL using the positive bias voltage V_P of the column voltage line L_C. At this time, the voltage level of the selected bit line BL may be adjusted to match the voltage level of the positive bias voltage V_P.

As a result, the current may flow from the selected bit line BL to the selected word line WL through the memory cell MC that is electrically connected between the selected word line WL and the selected bit line BL, among the plurality of memory cells MC. At this time, the state of the memory cell MC may be changed into the set state.

Figure 3:
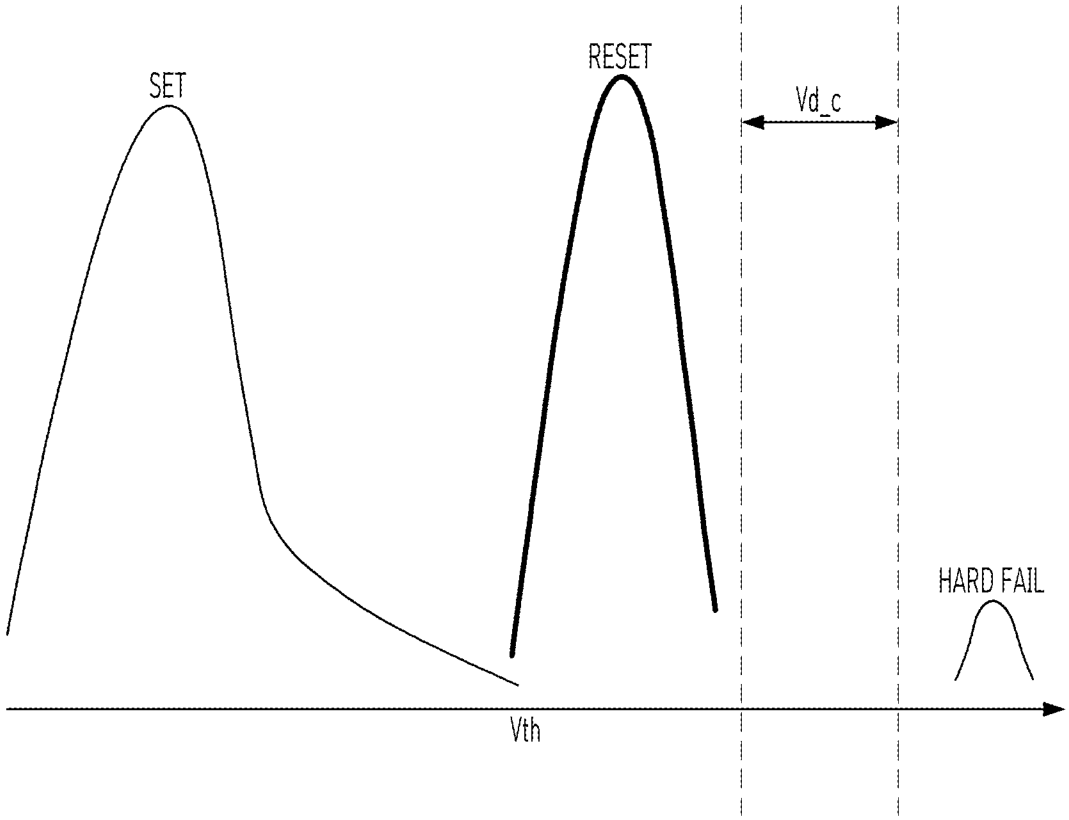
FIG. 3 describes threshold voltages of a memory cell included in a semiconductor device according to an embodiment of the present disclosure.

FIG. 3 describes threshold voltages of a memory cell included in a semiconductor device according to an embodiment of the present disclosure.

Referring to FIG. 3, a threshold voltage Vth of a memory cell MC included in the semiconductor device may have a lower voltage level when the memory cell MC is in a set state SET compared to when it is in a reset state RESET.

After the start of a write operation, a voltage difference Vd_c between both ends of the memory cell MC, specifically, between a selected bit line BL and a selected word line WL, may be configured to be greater when the memory cell MC is in the reset state RESET compared to when it is in the set state SET. Accordingly, after the start of the write operation, the memory cell MC in either the set state SET or the reset state RESET may be turned on or activated, allowing the current to flow through the memory cell MC.

As a result, after the start of the write operation, each of a positive bias voltage V_P and a negative bias voltage V_N may be controlled so that the voltage difference Vd_c between both ends of the memory cell, i.e., between the selected bit line BL and the selected word line WL is greater than the threshold voltage Vth of the memory cell MC in the reset state RESET. The positive bias voltage V_P and the negative bias voltage V_N are provided to the selected bit line BL and the selected word line WL. At this time, the difference Vd_c between voltage levels of the positive bias voltage V_P and the negative bias voltage V_N may be in a preset range that is greater than the threshold voltage Vth of the memory cell MC in the reset state RESET.

The threshold voltage Vth of the memory cell MC may be greater than the difference Vd_c between the voltage levels of the positive bias voltage V_P and the negative bias voltage V_N that are provided to the memory cell MC after the start of the write operation. In such a case, it is mentioned that a hard fail has occurred in the memory cell MC.

If the hard fail occurs in the memory cell MC, the memory cell MC may not be turned on. Accordingly, the write operation may not be performed normally because the memory cell MC is not turned on and thus the current does not flow into the memory cell MC.

Figure 4:
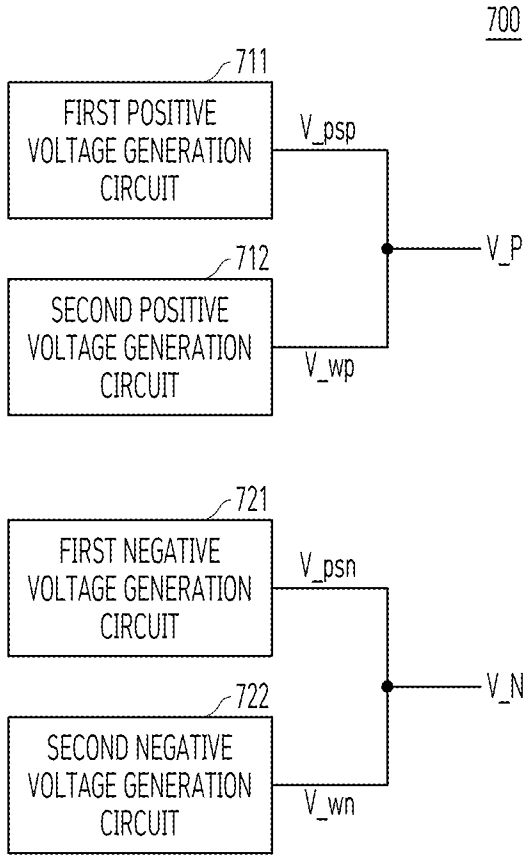
FIG. 4 illustrates a voltage generation circuit of a semiconductor device according to an embodiment of the present disclosure.

FIG. 4 illustrates a voltage generation circuit of a semiconductor device according to an embodiment of the present disclosure. The voltage generation circuit shown in FIG. 4 may correspond to the voltage generation circuit 700 included in the semiconductor device 1000 shown in FIG. 1.

Referring to FIG. 4, the voltage generation circuit 700 may include one or more positive voltage generation circuits 711 and 712 and one or more negative voltage generation circuits 721 and 722. For example, the voltage generation circuit 700 may include a first positive voltage generation circuit 711, a second positive voltage generation circuit 712, a first negative voltage generation circuit 721, and a second negative voltage generation circuit 722.

One or more of the first and second positive voltage generation circuits 711 and 712 may provide the positive bias voltage V_P to the current direction control circuit 200 during a write operation.

For example, in the write operation, the first positive voltage generation circuit 711 may first provide a voltage to the current direction control circuit 200, and then the second positive voltage generation circuit 712 may provide a voltage to the current direction control circuit 200. A first positive voltage V_psp output from the first positive voltage generation circuit 711 may be provided to the current direction control circuit 200 while the sensing circuit 800 of FIG. 1 performs a sensing operation. After that, a second positive voltage V_wp output from the second positive voltage generation circuit 712 may be provided to the current direction control circuit 200 until the write operation is completed. In an embodiment, the first positive voltage V_psp may have a higher or lower voltage level than the second positive voltage V_wp by a set level. In another embodiment, the first positive voltage V_psp and the second positive voltage V_wp may have the same voltage level. In this case, each of the first positive voltage V_psp and the second positive voltage V_wp may be provided to the current direction control circuit 200 as the positive bias voltage V_P.

In addition, one or more of the first and second negative voltage generation circuits 721 and 722 may provide the negative bias voltage V_N to the current direction control circuit 200 during the write operation.

In the write operation, the first negative voltage generation circuit 721 may first provide a voltage to the current direction control circuit 200, and then the second negative voltage generation circuit 722 may provide a voltage to the current direction control circuit 200. A first negative voltage V_psn output from the first negative voltage generation circuit 721 may be provided to the current direction control circuit 200 while the sensing circuit 800 performs the sensing operation. After that, a second negative voltage V_wn output from the second negative voltage generation circuit 722 may be provided to the current direction control circuit 200 until the write operation is completed. In an embodiment, the first negative voltage V_psn may have a higher or lower voltage level than the second negative voltage V_wn by a set level. In another embodiment, the first negative voltage V_psn and the second negative voltage V_wn may have the same voltage level. In this case, each of the first negative voltage V_psn and the second negative voltage V_wn may be provided to the current direction control circuit 200 as the negative bias voltage V_N.

Figure 5A:
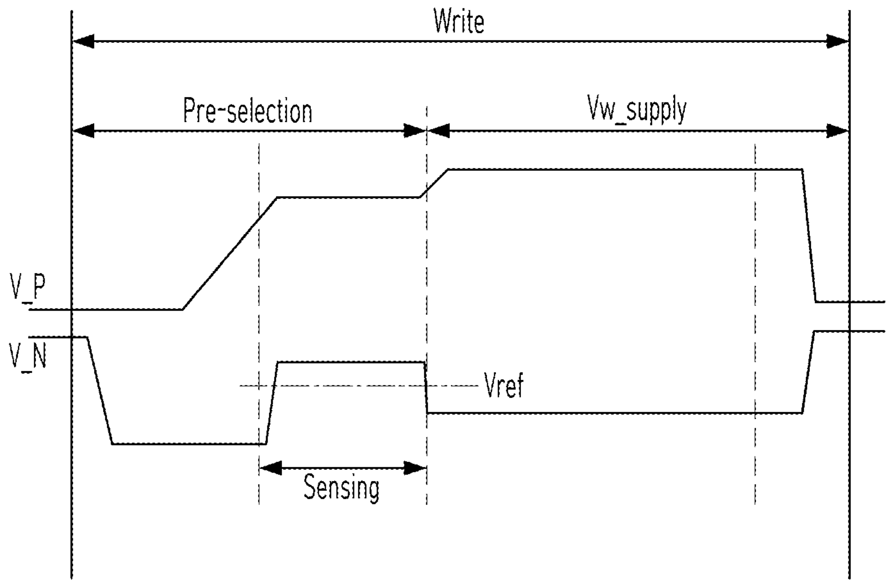
FIGS. 5A and 5B are timing diagrams for describing an operation of a semiconductor device according to an embodiment of the present disclosure.
Figure 5B:
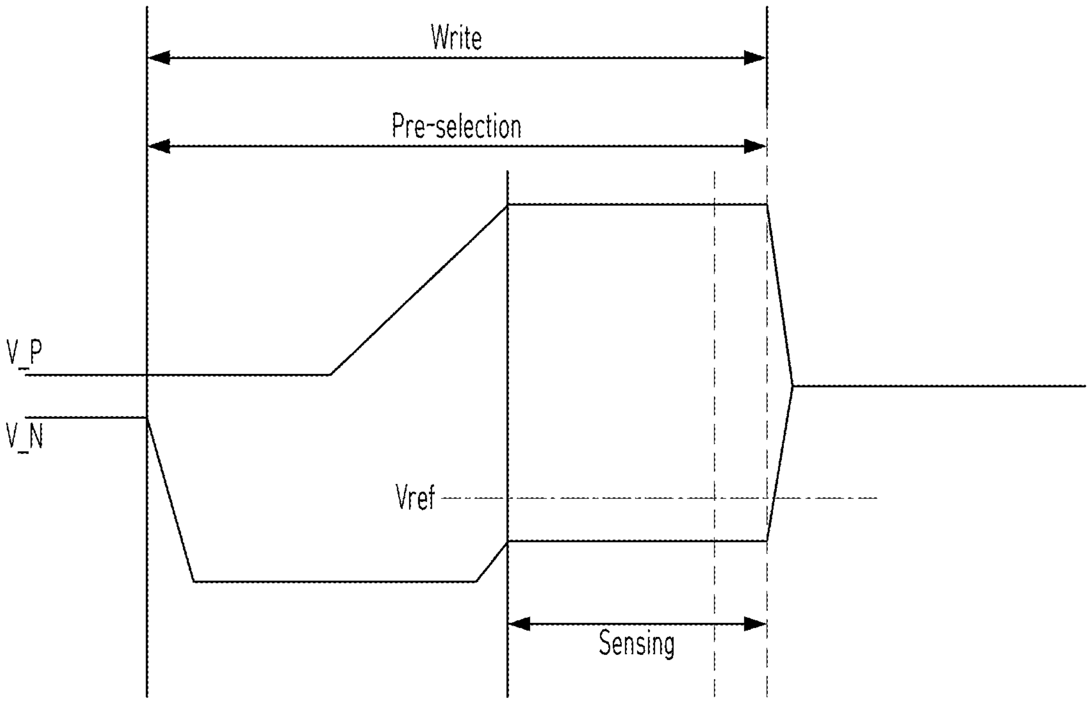

FIGS. 5A and 5B are timing diagrams for describing an operation of a semiconductor device according to an embodiment of the present disclosure. The operation shown in FIGS. 5A and 5B will be described with reference to the semiconductor device 1000 shown in FIG. 1.

Referring to FIG. 5A, an operation, particularly a write operation, of the semiconductor device may be performed during a write operation period (Write). The write operation period (Write) may include a pre-selection period (Pre-selection) and a voltage supply period (Vw_supply). In this case, the pre-selection period (Pre-selection) may be a period preceding the voltage supply period (Vw_supply).

When a write command is received and the write operation is initiated, the pre-selection period (Pre-selection) may precede the voltage supply period (Vw_supply). During the pre-selection period (Pre-selection), it is assessed whether a hard fail has occurred in a memory cell MC designated for the write operation. That is, the pre-selection period (Pre-selection) may be a period during which the status of the memory cell MC designated for data storage is examined to determine if it has failed.

For example, in the pre-selection period (Pre-selection), the positive bias voltage V_P and the negative bias voltage V_N may be applied to both ends of the memory cell MC, meaning they are applied to the bit line BL and the word line WL connected to the memory cell MC, respectively. In this case, timing at which the positive bias voltage V_P is applied may be later than timing at which the negative bias voltage V_N is applied. Furthermore, in the pre-selection period (Pre-selection), a difference between voltage levels of the positive bias voltage V_P and the negative bias voltage V_N that are applied to both ends of the memory cell MC may be greater than the threshold voltage Vth of the memory cell MC in the reset state RESET.

In the pre-selection period (Pre-selection), when the difference between the voltage levels of both ends of the memory cell MC in which data is to be stored is greater than the threshold voltage Vth of the memory cell MC in the reset state RESET, a current may flow into the memory cell MC. That is, the memory cell MC may be turned on. When the memory cell MC is turned on, the current may flow from a first end of the memory cell MC to a second end of the memory cell MC. A higher voltage is applied to the first end, and a lower voltage is applied to the second end. A voltage level of the second end of the memory cell MC may rise because the current is introduced into the second end of the memory cell MC. In this case, it is assumed that the positive bias voltage V_P is applied to the first end of the memory cell MC and the negative bias voltage V_N is applied to the second end of the memory cell MC. Accordingly, after the start of the write operation, in the pre-selection period (Pre-selection), when the voltage level of the second end of the memory cell MC rises, a voltage level of the negative bias voltage V_N applied to the second end of the memory cell MC may also rise.

After that, the sensing circuit 800 in FIG. 1 may sense the voltage level of the negative bias voltage V_N (Sensing). For example, the sensing circuit 800 may generate the sensing result signal S_R by sensing the voltage level of the negative bias voltage V_N, and may provide the sensing result signal S_R to the control circuit 100 in FIG. 1. According to an embodiment, when the voltage level of the negative bias voltage V_N is higher than a voltage level of a reference voltage Vref, the sensing circuit 800 may enable the sensing result signal S_R, and provide the control circuit 100 with the sensing result signal S_R that has been enabled.

The control circuit 100 that has received the sensing result signal S_R may determine that the memory cell MC has been turned on. That is, the control circuit 100 may determine that the memory cell MC is normal.

In the pre-selection period (Pre-selection), when the memory cell MC in which data is to be stored is determined to be normal, the voltage supply period (Vw_supply) may begin. That is, the positive bias voltage V_P and the negative bias voltage V_N may be provided to both ends of the memory cell MC, respectively, until the write operation is completed. For example, in the voltage supply period (Vw_supply), when the memory cell MC is determined to be normal, the control circuit 100 may provide the voltage control signal V_C to the voltage generation circuit 700 so that the voltage generation circuit 700 continues to supply the positive bias voltage V_P and the negative bias voltage V_N to the memory cell MC. As a result, in the voltage supply period (Vw_supply), the positive bias voltage V_P and the negative bias voltage V_N may be supplied to both ends of the normal memory cell MC until the write operation period (Write) is terminated. When the voltage supply period (Vw_supply) is terminated, the write operation is completed.

According to an embodiment, in the pre-selection period (Pre-selection), voltages that are provided to both ends of the memory cell MC may be provided by the first positive voltage generation circuit 711 and the first negative voltage generation circuit 721 in FIG. 4, respectively. In the voltage supply period (Vw_supply), voltages that are provided to both ends of the memory cell MC may be provided by the second positive voltage generation circuit 712 and the second negative voltage generation circuit 722, respectively. In this case, the voltage level of the first positive voltage V_psp that is provided by the first positive voltage generation circuit 711 may be equal to or lower than the voltage level of the second positive voltage V_wp that is provided by the second positive voltage generation circuit 712. Furthermore, the voltage level of the first negative voltage V_psn that is provided by the first negative voltage generation circuit 721 may be equal to or higher than the voltage level of the second negative voltage V_wn that is provided by the second negative voltage generation circuit 722.

The timing diagram illustrated in FIG. 5A may illustrate a write operation that is performed on a memory cell that has been determined to be normal.

Referring to FIG. 5B, an operation, in particular, a write operation of a semiconductor device according to an embodiment of the present disclosure, may be performed during a write operation period (Write). The write operation period (Write) may include a pre-selection period (Pre-selection).

In the pre-selection period (Pre-selection), it may be determined that a hard fail has occurred in the memory cell MC on which the write operation is to be performed when a write command is received. That is, in the pre-selection period (Pre-selection), whether the memory cell MC in which data is to be stored is a failed memory cell is checked.

For example, in the pre-selection period (Pre-selection), the positive bias voltage V_P and the negative bias voltage V_N may be applied to both ends of the memory cell MC, that is, the bit line BL and the word line WL that are connected to the memory cell MC, respectively. In this case, the application timing of the positive bias voltage V_P may occur after the timing of the application of the negative bias voltage V_N. Although not illustrated, in another embodiment, the application timing of the negative bias voltage V_N may be configured to be after the application timing of the positive bias voltage V_P.

Furthermore, in the pre-selection period (Pre-selection), a difference between the voltage levels of the positive bias voltage V_P and the negative bias voltage V_N that are applied to both ends of the memory cell MC, respectively, may be greater than the threshold voltage Vth of the memory cell MC in the reset state RESET.

In the pre-selection period (Pre-selection), when the difference between the voltage levels of both ends of the memory cell MC is greater than the threshold voltage Vth of the memory cell MC in the reset state RESET, a current may flow into the memory cell MC. That is, when the memory cell MC is normal, the memory cell MC may be turned on, and thus make the current flow therethrough.

However, as illustrated in FIG. 5B, although the positive bias voltage V_P and the negative bias voltage V_N that enable a voltage difference therebetween to be higher than the threshold voltage Vth of the memory cell MC in the reset state RESET are applied to both ends of the memory cell MC, the voltage level of the negative bias voltage V_N may not rise higher than the voltage level of the reference voltage Vref. This means that a current may not flow into the memory cell MC because the memory cell MC is not turned on. Furthermore, this means that the memory cell MC is in a state in which the threshold voltage Vth of the memory cell MC has become higher than a voltage level corresponding to the difference between the voltage levels of the positive bias voltage V_P and the negative bias voltage V_N. Such a memory cell MC may be a memory cell MC in which a hard fail has occurred as illustrated in FIG. 3.

The sensing circuit 800 in FIG. 1 may sense the voltage level of the negative bias voltage V_N. For example, the sensing circuit 800 may generate the sensing result signal S_R by sensing the voltage level of the negative bias voltage V_N, and may provide the sensing result signal S_R to the control circuit 100. According to an embodiment, when the voltage level of the negative bias voltage V_N is lower than the voltage level of the reference voltage Vref, the sensing circuit 800 may disable the sensing result signal S_R and provide the control circuit 100 with the sensing result signal S_R that has been disabled. The control circuit 100 that has received the sensing result signal S_R that has been disabled may sense that the memory cell MC has not been turned on. That is, the control circuit 100 may determine that the memory cell MC is a failed memory cell.

When the memory cell MC is determined to be a failed memory cell in the pre-selection period (Pre-selection), the voltage supply period (Vw_supply) may not begin. That is, data may not be stored in the memory cell MC, and the write operation may be terminated. The control circuit 100 that has received the disabled sensing result signal S_R may provide the voltage generation circuit 700 with the voltage control signal V_C that blocks the voltage generation circuit 700 from supplying the positive bias voltage V_P and the negative bias voltage V_N to the current direction control circuit 200.

As a result, during the write operation, when the memory cell MC is determined to be a failed memory cell, the semiconductor device 1000 may terminate the write operation without performing an operation of storing data in the memory cell MC by blocking the positive bias voltage V_P and the negative bias voltage V_N from being provided to the memory cell MC.

Referring to FIGS. 5A and 5B, during the write operation, the semiconductor device 1000 may determine whether a memory cell in which data is to be stored is a normal memory cell or a failed memory cell, provide the positive bias voltage V_P and the negative bias voltage V_N to the normal memory cell so that data is stored in the normal memory cell, and block the positive bias voltage and the negative bias voltage from being provided to the failed memory cell so that the data is not stored in the failed memory cell.

In an embodiment of the present disclosure, voltages applied to the bit line BL and the word line WL, respectively, have been described by taking the positive bias voltage V_P and the negative bias voltage V_N having different polarities as an example. However, in another embodiment, voltages having the same polarity may be applied to the bit line BL and the word line WL, but may be configured to have a voltage difference between the bit line BL and the word line WL. Furthermore, in still another embodiment, a voltage difference between the bit line BL and the word line WL may be implemented by applying the positive bias voltage V_P or the negative bias voltage V_N to one of the bit line BL and the word line WL and applying a ground voltage 0V to the other one of the bit line BL and the word line WL.

Figure 6:
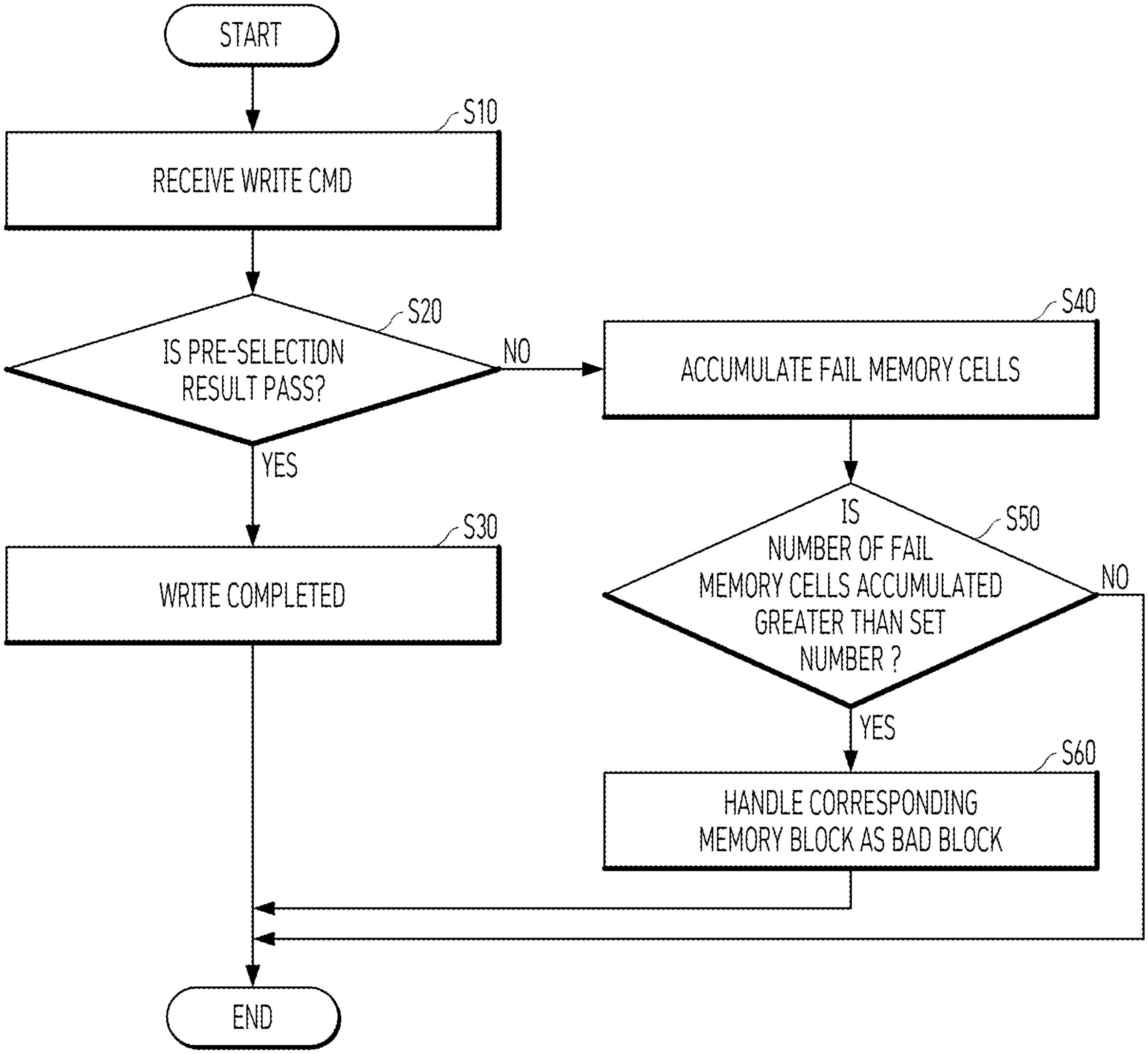
FIG. 6 is a flowchart for describing an operating method of a semiconductor device according to an embodiment of the present disclosure.

FIG. 6 is a flowchart for describing an operating method of a semiconductor device according to an embodiment of the present disclosure. The operating method shown in FIG. 6 will be described with reference to the semiconductor device 1000 shown in FIG. 1.

Referring to FIG. 6, the operating method may include a write command reception step S10, a pre-selection result determination step S20, a write operation completion step S30, a fail accumulation step S40, an accumulation determination step S50, and a bad block handling step S60.

The write command reception step S10 may include a step of checking whether a write command Write CMD has been received by the semiconductor device 1000. For example, the write command reception step S10 may check whether a command CMD received by the control circuit 100 is the write command Write CMD.

The pre-selection result determination step S20 may be a step of determining whether a memory cell in which data is to be stored during a write operation is a failed memory cell or not. The pre-selection result determination step S20 may be performed in the pre-selection period (Pre-selection) in FIGS. 5A and 5B, and may include a step of sensing, by the sensing circuit 800 in FIG. 1, the voltage level of the negative bias voltage V_N, among the positive bias voltage V_P and the negative bias voltage V_N that are provided to the memory cell during the write operation, and a step of comparing the sensed voltage level of the negative bias voltage V_N and the voltage level of the reference voltage Vref.

When it is determined that the voltage level of the negative bias voltage V_N is equal to or higher than the voltage level of the reference voltage Vref in the pre-selection result determination step S20, the memory cell may be determined to be normal (PASS) (YES), and then the write operation completion step S30 may be performed.

In the present embodiment, an example in which a failure of a memory cell is determined by comparing the voltage level of the negative bias voltage V_N with the voltage level of the reference voltage Vref has been described, but embodiments of the present disclosure are not limited thereto. As another embodiment, whether a memory cell is a failed memory cell or not may be determined by comparing the voltage level of the positive bias voltage V_P with the voltage level of the reference voltage Vref.

As still another embodiment, whether a memory cell is a failed memory cell or not may be determined by comparing a difference between the voltages of the bit line BL and the word line WL with a reference value. For example, if the difference between the voltages of the bit line BL and the word line WL is determined to be equal to or lower than the reference value, the memory cell may be determined to be normal. On the other hand, if the difference between the voltages of the bit line BL and the word line WL is determined to be higher than the reference value, the memory cell may be determined to be failed.

The write operation completion step S30 may be performed in the voltage supply period (Vw_supply) illustrated in FIG. 5A, and may include a step of continuously supplying the positive bias voltage V_P and the negative bias voltage V_N to both ends of the memory cell MC so that data is stored in the memory cell MC normally.

When it is determined that the voltage level of the negative bias voltage V_N is lower than the voltage level of the reference voltage Vref in the pre-selection result determination step S20, the memory cell MC may be determined to be a failed memory cell (NO), and then the fail accumulation step S40 may be performed.

The fail accumulation step S40 may include a step of storing the number of memory cells each determined to be a failed memory cell in the pre-selection result determination step S20 by accumulating the number of failed memory cells for each set area. In this case, the set area may include a memory block or a page. According to an embodiment, the control circuit 100 may store the number of failed memory cells accumulated for each set area in a given area of the memory cell array 500.

The accumulation determination step S50 may include a step of checking whether the number of failed memory cells accumulated for each set area is greater than a set number.

When it is determined that the number of failed memory cells accumulated for each set area is not greater than the set number in the accumulation determination step S50 (NO), the operating method may be terminated.

On the other hand, when it is determined that the number of failed memory cells accumulated for each set area is greater than the set number in the accumulation determination step S50 (YES), the bad block handling step S60 may be performed.

The bad block handling step S60 may be performed when the number of failed memory cells for each memory block is greater than the set number, and may include a step of marking a memory block in which the number of failed memory cells is greater than the set number, so that data is no longer stored in the failed memory cells, and a step of replacing the marked memory block with another memory block.

The semiconductor device 1000 according to the embodiment of the present disclosure can improve the reliability of a write operation by performing the write operation based on a determination of whether a memory cell in which data is to be stored is failed or not after the start of the write operation. Furthermore, the number of memory cells each determined to be a failed memory cell after the start of the write operation can be accumulated and stored for each memory block, and bad block handling can be performed based on the number of failed memory cells accumulated for each memory block.

Although embodiments according to the technical spirit of the present disclosure have been described above with reference to the accompanying drawings, the embodiments have been provided to merely describe embodiments according to the concept of the present disclosure, and the present disclosure is not limited to the embodiments. A person having ordinary knowledge in the art to which the present disclosure pertains may substitute, modify, and change the embodiments in various ways without departing from the technical spirit of the present disclosure written in the claims. Such substitutions, modifications, and changes may be said to belong to the scope of the present disclosure.

What is claimed is:

1. A semiconductor device, comprising:

a voltage generation circuit configured to provide bias voltages to both ends of a memory cell or to block the provision of the bias voltages in response to a voltage control signal in a write operation;

a sensing circuit configured to generate a sensing result signal by sensing a voltage level of any one of the both ends of the memory cell in the write operation; and a control circuit configured to generate the voltage control signal by determining whether the memory cell is a failed memory cell or a normal memory cell based on the sensing result signal, wherein the control circuit generates the voltage control signal that provides the bias voltages to the both ends of the memory cell when the memory cell is determined to be normal based on the sensing result signal, and blocks the provision of the bias voltages to both ends of the memory cell when the memory cell is determined to be failed based on the sensing result signal.

2. The semiconductor device of claim 1, wherein the sensing circuit generates the sensing result signal by sensing a bias voltage having a lower voltage level, among the bias voltages that are provided to the both ends of the memory cell in the write operation.

3. The semiconductor device of claim 2, wherein the sensing circuit is configured to:

enable the sensing result signal when the bias voltage having the lower level is equal to or greater than a reference voltage; and disable the sensing result signal when the bias voltage having the lower level is less than the reference voltage.

4. The semiconductor device of claim 3, wherein the control circuit is configured to:

determine the memory cell to be the normal memory cell when the sensing result signal is enabled and generate the voltage control signal that enables the bias voltages to be provided to the both ends of the memory cell; and determine the memory cell to be the failed memory cell when the sensing result signal is disabled and generate the voltage control signal that blocks the bias voltages from being provided to the both ends of the memory cell.

5. The semiconductor device of claim 4, wherein the control circuit is configured to:

accumulate a number of memory cells identified as failed memory cells for each memory block; and treat a corresponding memory block as a bad block when the number of memory cells accumulated is greater than a set number, preventing any data from being stored in the bad block.

6. A semiconductor device, comprising:

a memory cell that is connected between a bit line and a word line;

a voltage generation circuit configured to provide one of a positive bias voltage and a negative bias voltage to the bit line and provide the other of the positive bias voltage and the negative bias voltage to the word line, or block the provision of the positive bias voltage and the negative bias voltage based on a voltage control signal in a write operation;

a sensing circuit configured to generate a sensing result signal by sensing a voltage level of the negative bias voltage in the write operation; and a control circuit configured to generate the voltage control signal based on the sensing result signal in the write operation, wherein the control circuit generates the voltage control signal that provides the bias voltages to the bit line and the word line when the memory cell is determined to be normal based on the sensing result signal, and blocks the provision of the bias voltages to the bit line and the word line when the memory cell is determined to be failed based on the sensing result signal.

7. The semiconductor device of claim 6, wherein the sensing circuit is configured to:

enable the sensing result signal when the voltage level of the negative bias voltage is equal to or greater than a voltage level of a reference voltage; and disable the sensing result signal when the voltage level of the negative bias voltage is less than the voltage level of the reference voltage.

8. The semiconductor device of claim 7, wherein the control circuit is configured to:

provide the voltage generation circuit with the voltage control signal that enables one of the positive bias voltage and the negative bias voltage to be provided to the bit line and enables the other of the positive bias voltage and the negative bias voltage to be provided to the word line, when receiving the sensing result signal that has been enabled; and provide the voltage generation circuit with the voltage control signal that blocks one of the positive bias voltage and the negative bias voltage from being provided to the bit line and blocks the other of the positive bias voltage and the negative bias voltage from being provided to the word line when receiving the sensing result signal that has been disabled.

* * * * *